(12) United States Patent
Furuya

(10) Patent No.: US 6,756,808 B2
(45) Date of Patent: Jun. 29, 2004

(54) CLOCK EDGE DETECTION CIRCUIT

(75) Inventor: Yasunari Furuya, Nagano-ken (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/145,565

(22) Filed: May 14, 2002

(65) Prior Publication Data

US 2002/0196052 A1 Dec. 26, 2002

(30) Foreign Application Priority Data

Jun. 21, 2001 (JP) .................................... 2001-188169

(51) Int. Cl.[7] .......................................... H03K 19/003

(52) U.S. Cl. ............................ 326/9; 326/12; 326/14

(58) Field of Search ............................... 326/9, 14, 16, 326/93, 94; 327/2, 12, 24

(56) References Cited

U.S. PATENT DOCUMENTS 5,619,148 A  *  4/1997  Guo .............................. 327/3
6,404,240 B1 *  6/2002  Hakkal et al. ................ 327/12

* cited by examiner

*Primary Examiner*—Anh Tran
(74) *Attorney, Agent, or Firm*—Harness, Dickey & Pierce, P.L.C.

(57) ABSTRACT

The clock edge detection circuit is equipped with a first delay circuit 11 that delays a first clock signal and outputs a first delay clock signal, a second delay circuit 21 that delays a second clock signal and outputs a second delay clock signal, a first retaining circuit 12 that retains a level of the first delay clock signal at an edge of the second clock signal, a second retaining circuit 22 that retains a level of the first clock signal at an edge of the second delay clock signal, and a logical circuit 13 that outputs, based on the output signals of the first and second retaining circuits, a detection signal representing whether or not an edge of the first clock signal and an edge of the second clock signal are within a predetermined time range.

5 Claims, 5 Drawing Sheets

US 6,756,808 B2

CLOCK EDGE DETECTION CIRCUIT

BACKGROUND

1. Technical Field

The present invention relates to clock edge detection circuits that detect whether or not the edges of two clock signals coincide with each other.

2. Related Art

In general, a clock edge detection circuit is a circuit that is built in a semiconductor integrated circuit for conducting an operation test of a circuit such as a PLL (phase locked loop) circuit that generates an output signal with a phase synchronized with an input signal.

FIG. 5 shows an example of a structure of a conventional clock edge detection circuit. The clock edge detection circuit detects whether or not an edge of a reference clock signal R that becomes an input signal of a PLL circuit coincides with an edge of a comparison clock signal F that is an output signal of the PLL circuit. The reference clock signal R is inputted in one of input terminals of an EOR (Exclusive OR) circuit 1, and the comparison clock signal F is inputted in the other of the input terminals.

When a time difference is present between the edge of the reference clock signal R and the edge of the comparison clock signal F, the EOR circuit 1 outputs a pulse having a width corresponding to the time difference. The output signal of the EOR circuit 1 is supplied to a clock input C of a flip-flop 2. In the flip-flop 2, a data input D is at a high level, and therefore a level of an output Q thereof becomes high, when the EOR circuit 1 outputs the pulse. The flip-flop 2 is reset and the operation described above is repeated; and when the output Q of the flip-flop 2 does not become a high level, it can be said that the edge of the reference clock signal R and the edge of the comparison clock signal coincide with each other.

However, the conventional clock edge detection circuit has to process a pulse with a very narrow width when an edge of the reference clock signal R and an edge of the comparison clock signal F are close to one another. As a result, the operation is apt to become unstable due to noises, deviations in circuit elements, temperature changes and so forth.

In view of the above, it is an object of the present invention to provide a clock edge detection circuit that can stably detect whether or not the edges of two clock signals coincide with each other within a predetermined time range.

SUMMARY

To solve the problem described above, a clock edge detection circuit in accordance with the present invention comprises: a first delay circuit that delays a first clock signal and outputs a first delay clock signal; a second delay circuit that delays a second clock signal and outputs a second delay clock signal; a first retaining circuit that retains a level of the first delay clock signal at an edge of the second clock signal; a second retaining circuit that retains a level of the first clock signal at an edge of the second delay clock signal; and a logical circuit that outputs, based on the output signals of the first and second retaining circuits, a detection signal representing whether or not an edge of the first clock signal and an edge of the second clock signal are within a predetermined time range.

Here, each of the first and second delay circuits may include a buffer circuit. Alternatively, each of the first and second delay circuits may include a variable delay circuit. Also, each of the first and second retaining circuits may include a flip-flop. Furthermore, the logical circuit may provide a logical product of a reversed logical value of an output signal of the first retaining circuit and an output signal of the second retaining circuit.

By the clock edge detection circuit of the present embodiment thus composed, positions of the edges are detected by using the first and second clock signals and the clock signals having specified delays added to these clock signals. As a result, it is possible to stably detect whether or not the edge of the first clock signal and the edge of the second clock signal are within a predetermined time range.

DETAILED DESCRIPTION

Embodiments of the present invention will be described below with reference to the accompanying drawings. It is noted that identical components are indicated by the same reference numbers and their description is not duplicated.

Figure 1:
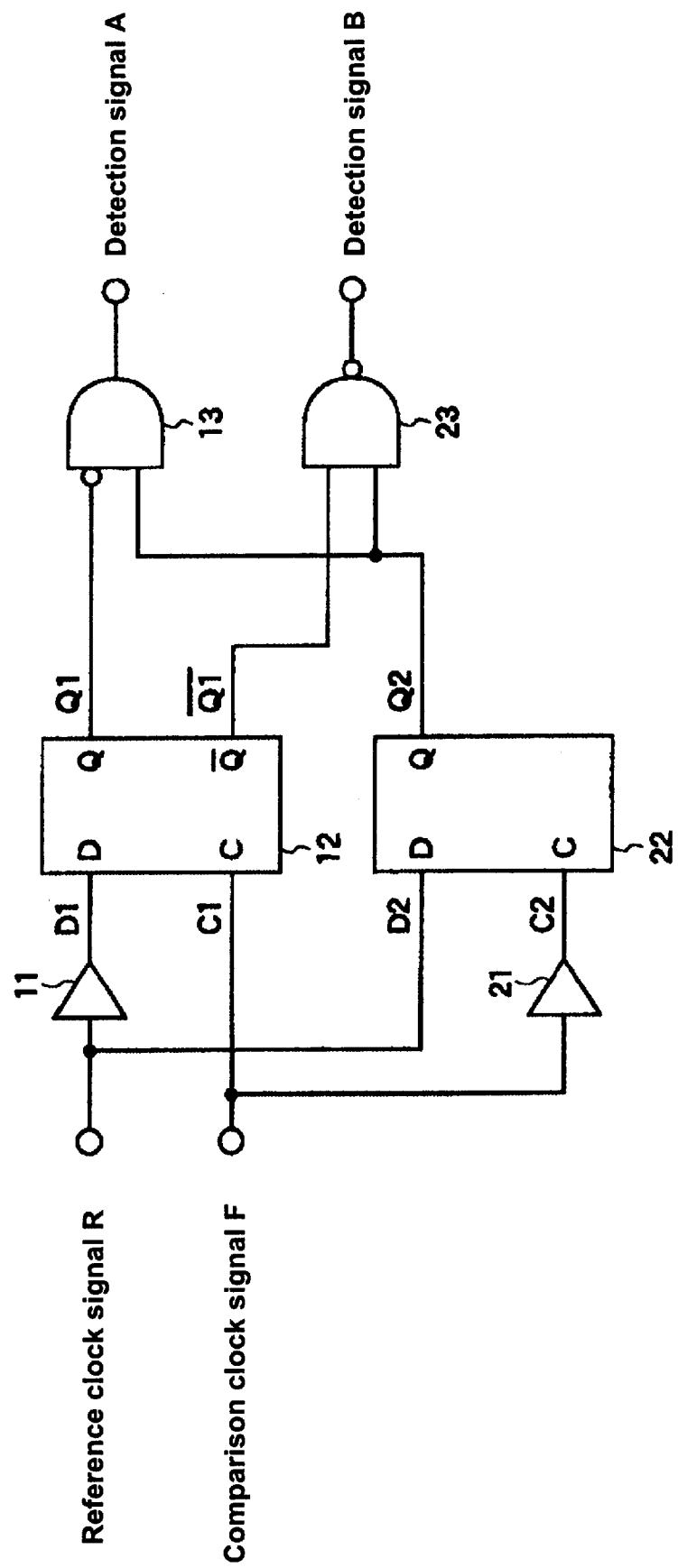
FIG. 1 is a circuit diagram of a structure of a clock edge detection circuit in accordance with a first embodiment of the present invention.

FIG. 1 is a circuit diagram of a structure of a clock edge detection circuit in accordance with a first embodiment of the present invention. The clock edge detection circuit detects whether or not, for example, a rising edge of a reference clock signal R that becomes an input signal of a PLL circuit and a rising edge of a comparison clock signal F that is an output signal of the PLL circuit are within a predetermined time range. The reference clock signal R is inputted in one of the input terminals of the clock edge detection circuit and the comparison clock signal F is inputted in the other input terminal.

The clock edge detection circuit includes a buffer circuit 11 that delays the reference clock signal R by a time T1 and outputs a delayed reference clock signal, and a buffer circuit 21 that delays the comparison clock signal F by a time T2 and outputs a delayed comparison clock signal. It is noted that a variety of other gate circuits may be used instead of the buffer circuits. Also, the clock edge detection circuit includes flip-flops 12 and 22 that receive these clock signals, and an AND circuit 13 that is connected to outputs of the flip-flops 12 and 22. Furthermore, a NAND circuit 23 may be provided along with the AND circuit 13 or in place of the AND circuit 13.

In the flip-flop 12, the delayed reference clock signal outputted from the buffer circuit 11 is supplied as a data input signal D1, and the comparison clock signal F is supplied as a clock input signal C1. The flip-flop 12 retains a level of the delayed reference clock signal at a rising edge of the comparison clock signal F.

In the mean time, in the flip-flop 22, the reference clock signal R is supplied as a data input signal D2, and the delayed comparison clock signal outputted from the buffer circuit 21 is supplied as a clock input signal C2. The flip-flop 22 retains a level of the reference clock signal R at a rising edge of the delayed comparison clock signal.

An output signal Q1 of the flip-flop 12 is supplied in one of the inputs (reversed input) of the AND circuit 13, and an output signal Q2 of the flip-flop 22 is supplied in the other input. It is noted that the one input of the AND circuit 13 may not be made as the reversed input, and instead a reversed output signal Q1 bar of the flip-flop 12 may be supplied. Based on the output signals of the flip-flops 12 and 22, the AND circuit 13 outputs a detection signal A that becomes a high level when the rising edge of the reference clock signal R and the rising edge of the comparison clock signal F are within a predetermined time range.

A reversed output signal Q1 bar of the flip-flop 12 is supplied in one of the inputs of the NAND circuit 23, and an output signal Q2 of the flip-flop 22 is supplied in the other input. Based on the output signals of the flip-flops 12 and 22, the NAND circuit 23 outputs a detection signal B that becomes a high level when the rising edge of the reference clock signal R and the rising edge of the comparison clock signal F are outside of a predetermined time range.

Next, an operation of the clock edge detection circuit in accordance with the present embodiment will be described with reference to FIGS. 1 and 2.

Figure 2:
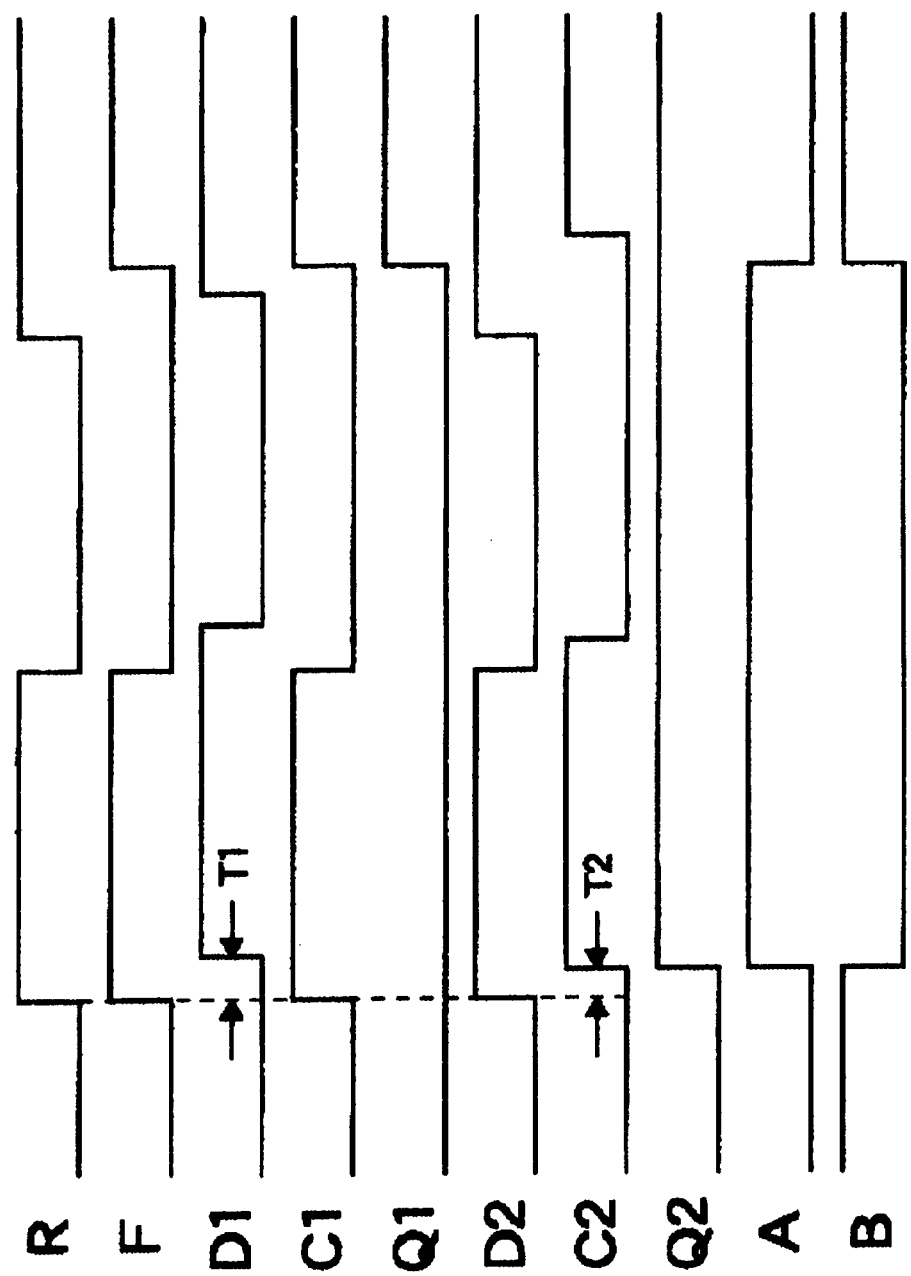
FIG. 2 is a timing chart showing operation timings of the clock edge detection circuit in accordance with the first embodiment of the present invention.

FIG. 2 shows the rising edges of the reference clock signal R and the rising edges of the comparison clock signal F. A delayed reference clock signal, in which the reference clock signal R is delayed by a time T1, is supplied as the data input signal D1 to the flip-flop 12, and the comparison clock signal F is supplied as the clock input signal C1 to the flip-flop 12. At the first rising edge of the clock input signal C1, the reference clock signal R and the comparison clock signal F are synchronized with each other, and therefore the data input signal D1 is at a low level, and the output signal Q1 of the flip-flop 12 also remains also at a low level. At the second rising edge of the clock input signal C1, the reference clock signal R and the comparison clock signal F have been deviated from each other in the synchronization, and therefore the data input signal D1 has assumed a high level, and the output signal Q1 of the flip-flop 12 also changes to a high level.

In the mean time, the reference clock signal R is supplied as the data input signal D2 to the flip-flop 22, and a delayed comparison clock signal, in which the comparison clock signal F is delayed by a time T2, is supplied as the clock input signal C2 to the flip-flop 22. At the first rising edge of the clock input signal C2, the reference clock signal R and the comparison clock signal F are synchronized with each other, and therefore the data input signal D2 assumes a high level, and the output signal Q2 of the flip-flop 22 changes to a high level. At the second rising edge of the clock input signal C2, the data input signal D2 is at a high level, and the output signal Q2 of the flip-flop 22 remains at a high level.

When the output signal Q1 of the flip-flop 12 is at a low level, and the output signal Q2 of the flip-flop 22 changes to a high level, the detection signal A outputted from the AND circuit 13 becomes a high level, which indicates that the rising edge of the reference clock signal R and the rising edge of the comparison clock signal F are within a predetermined time range. Further, when the output signal Q1 of the flip-flop 12 changes to a high level, the detection signal A becomes a low level, which indicates that the rising edge of the reference clock signal R and the rising edge of the comparison clock signal F are outside the predetermined time range. Also, the detection signal B outputted from the NAND circuit 23 assumes an opposite logical value with respect to that of the detection signal A outputted from the AND circuit 13.

Here, when the rising edge of the comparison clock signal F is delayed by a time exceeding the delay time T1 of the buffer circuit 11 With respect to the rising edge of the reference clock signal R, a determination is made that they are outside of the predetermined time range. Also, when the rising edge of the comparison clock signal F advances by a time greater than the time delay T2 of the buffer circuit 21, a determination is made that they are outside of the predetermined time range.

Next, a second embodiment of the present invention will be described.

Figure 3:
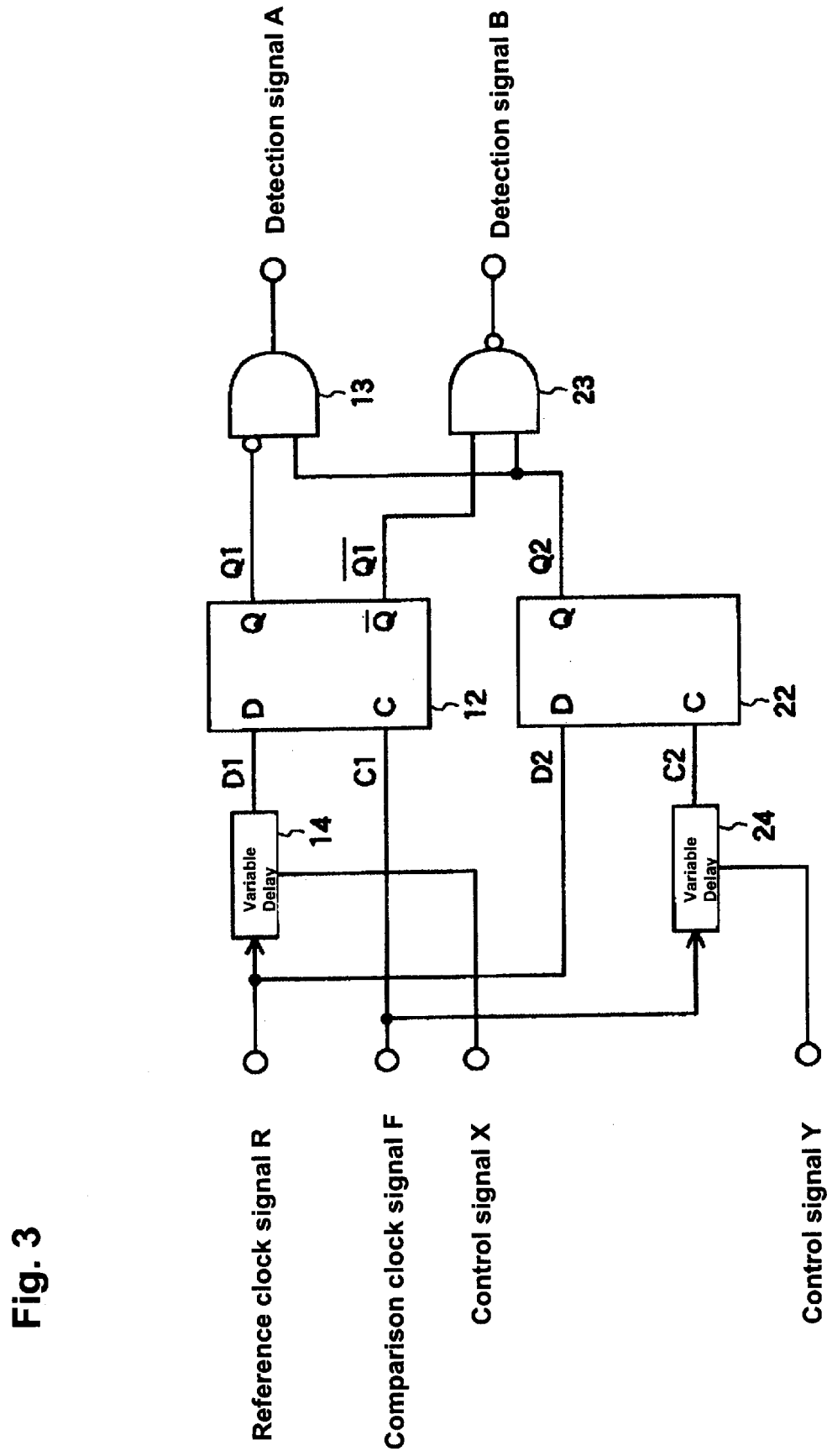
FIG. 3 is a circuit diagram of a structure of a clock edge detection circuit in accordance with a second embodiment of the present invention.

FIG. 3 is a circuit diagram of a structure of a clock edge detection circuit in accordance with a second embodiment of the present invention. In the present embodiment, variable delay cells 14 and 24 are used as circuits to delay the clock signals, instead of the buffer circuits 11 and 21 shown in FIG. 1. The variable delay cell is a cell that includes a delay circuit that can change the delay time according to a control signal.

Figure 4:
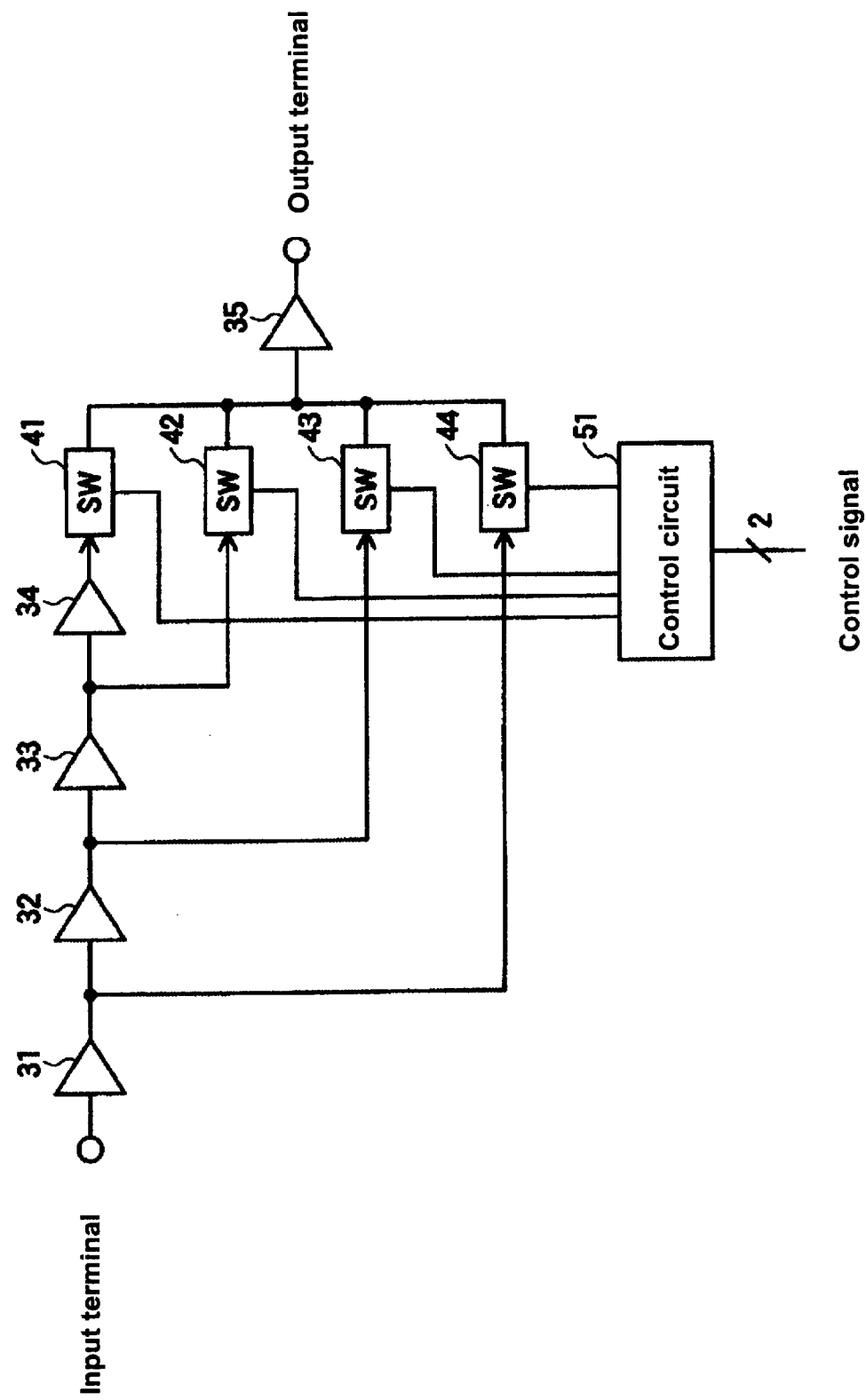
FIG. 4 shows an example of a structure of variable delay cells shown in FIG. 3.
Figure 5:
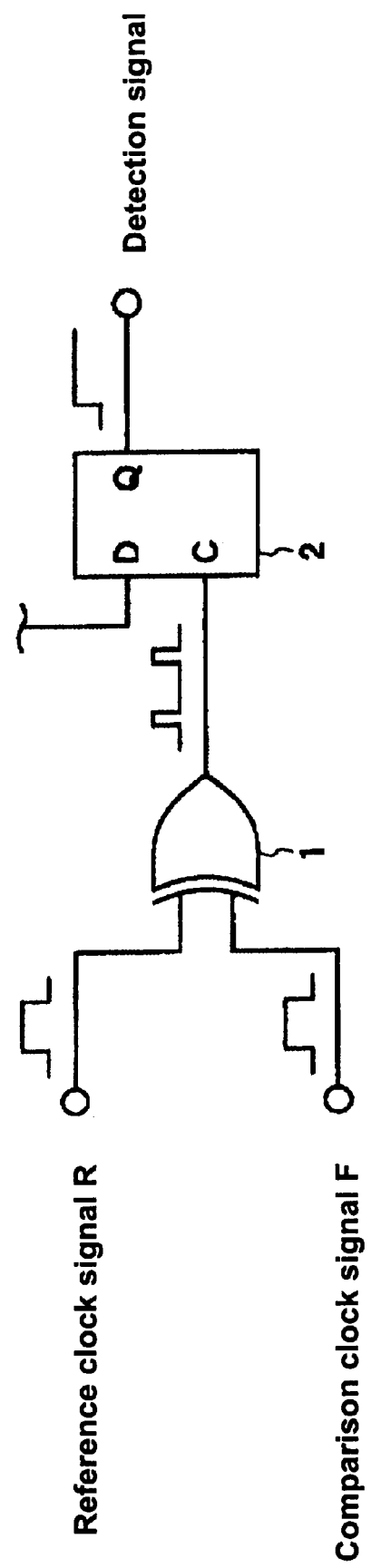
FIG. 5 is a circuit diagram of a structure of a conventional clock edge detection circuit.

FIG. 4 shows an example of a structure of the variable delay cell. As shown in FIG. 4, the variable delay cell includes serially connected buffer circuits 31–34 having specified delay times, analog switches 41–44 for switching the output signals of the buffer circuits 31–34, a control circuit 51 that controls the operation of the analog switches 41–44 according to a control signal, and a buffer circuit 35 that outputs a clock signal that is outputted from one of the analog switches 41–44. Each of the buffer circuits 31–35 provides a delay time of 100 p seconds, for example. Accordingly, by the variable delay cells, delay times ranging from 200 p seconds to 500 p seconds can be obtained. In this manner, the delay time may be provided in a variable manner. This is convenient because the predetermined time range for determining if the reference clock signal R coincides with the comparison clock signal F can be readily changed.

By providing a clock edge detection circuit in accordance with the present invention in a manner described above, the clock edge detection circuit is difficult to be affected by noises, deviations in the circuit elements, temperature changes and the like, and can stably detect whether or not the edges of two clock signals coincide with each other within a predetermined time range. The entire disclosure of Japanese Patent Application No. 2001-188169 filed Jun. 21, 2001 is incorporated by reference herein.

What is claimed is:

1. A clock edge detection circuit comprising:
    a first delay circuit that delays a first clock signal and outputs a first delay clock signal;
    a second delay circuit that delays a second clock signal and outputs a second delay clock signal;
    a first retaining circuit that outputs a signal at a level of the first delay clock signal at an edge of the second clock signal;
    a second retaining circuit that outputs a signal at a level of the first clock signal at an edge of the second delay clock signal; and a logical circuit that outputs, based on output signals of the first and second retaining circuits, a detection signal representing whether or not an edge of the first clock signal and an edge of the second clock signal are within a predetermined time range.

2. A clock edge detection circuit according to claim 1, wherein each of the first and second delay circuits includes a buffer circuit.

3. A clock edge detection circuit according to claim 1, wherein each of the first and second delay circuits includes a variable delay circuit.

4. A clock edge detection circuit according to claim 1 wherein each of the first and second retaining circuits includes a flip-flop.

5. A clock edge detection circuit according to claim 1, wherein the logical circuit provides a logical product of a reversed logical value of an output signal of the first retaining circuit and an output signal of the second retaining circuit.

* * * * *